United States Patent
Cheng et al.

(10) Patent No.: US 9,496,341 B1
(45) Date of Patent: Nov. 15, 2016

(54) SILICON GERMANIUM FIN

(71) Applicant: GLOBALFOUNDRIES INC., Grand Cayman OT (KY)

(72) Inventors: Kangguo Cheng, Schenectady, NY (US); Judson Holt, Wappinger Falls, NY (US); Shogo Mochizuki, Tokyo (JP)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/730,320

(22) Filed: Jun. 4, 2015

(51) Int. Cl.
*H01L 29/47* (2006.01)
*H01L 29/10* (2006.01)
(Continued)

(52) U.S. Cl.
CPC ..... *H01L 29/1054* (2013.01); *H01L 21/02529* (2013.01); *H01L 21/02532* (2013.01);
(Continued)

(58) Field of Classification Search
CPC .......... H01L 21/02529; H01L 21/02532; H01L 21/30604; H01L 21/324; H01L
(Continued)

(56) References Cited

U.S. PATENT DOCUMENTS 8,048,723 B2 11/2011 Chang et al.
8,202,768 B2 * 6/2012 Lander .............. H01L 29/66795
257/E21.32
(Continued)

FOREIGN PATENT DOCUMENTS

CN 103972104 A 8/2014

OTHER PUBLICATIONS

Anonymous, "Complementary Metal-Oxide Semiconductor (CMOS) Fin-Shaped Field Effect Transistor (FinFET) with High Germanium (Ge) Content and Method for Fabricating the CMOS FinFET", ip.com, Aug. 7, 2014, IP.com No. 000238188.
(Continued)

*Primary Examiner* — Hung Vu
(74) *Attorney, Agent, or Firm* — Yuanmin Cai, Esq.

(57) ABSTRACT

A method includes forming a multilayered stack on a surface of a supporting layer. The multilayered stack is composed of alternating layers of compressively strained Silicon Germanium ($Si_{1-x}Ge_x$) and tensily strained Carbon-doped Silicon (Si:C). The method further includes etching the multilayered stack to form at least one Fin precursor structure and annealing the Fin precursor structure to remove Carbon from the strained Si:C layers to form Carbon-depleted layers and to diffuse Germanium from the $Si_{1-x}Ge_x$ layers into the Carbon-depleted layers producing a $Si_{1-x}Ge_x$ Fin. A structure that is disclosed includes a Semiconductor on Insulator (SOI) layer disposed on a layer of buried oxide and a multilayered stack on a surface of the SOI layer. The multilayered stack is composed of alternating layers of compressively strained $Si_{1-x}Ge_x$ and tensily strained Si:C. The structure further includes a hardmask layer disposed on a top surface of the multilayered stack.

14 Claims, 2 Drawing Sheets

(51) Int. Cl.
*H01L 29/78* (2006.01)
*H01L 29/16* (2006.01)
*H01L 29/161* (2006.01)
*H01L 21/02* (2006.01)
*H01L 21/306* (2006.01)
*H01L 21/324* (2006.01)
*H01L 21/762* (2006.01)
*H01L 29/06* (2006.01)

(52) U.S. Cl.
CPC ....... *H01L 21/30604* (2013.01); *H01L 21/324* (2013.01); *H01L 21/7624* (2013.01); *H01L 29/0649* (2013.01); *H01L 29/161* (2013.01); *H01L 29/1608* (2013.01); *H01L 29/785* (2013.01)

(58) Field of Classification Search
CPC .......... 21/7624;H01L 29/0649; H01L 29/1054; H01L 29/1608; H01L 29/161; H01L 29/785
USPC .......... 438/105, 149, 156, 157, 931
See application file for complete search history.

(56) References Cited

U.S. PATENT DOCUMENTS

| | | | |
|---|---|---|---|
| 8,211,772 B2 | 7/2012 | Kavalieros et al. | |
| 2004/0219722 A1* | 11/2004 | Pham | H01L 29/785 438/157 |
| 2014/0252483 A1 | 9/2014 | Nagumo et al. | |
| 2014/0357060 A1 | 12/2014 | Liu et al. | |
| 2015/0069327 A1* | 3/2015 | Cheng | H01L 29/158 257/19 |

OTHER PUBLICATIONS

K. Eberl et al., "Strain Symmetrization Effects in Pseudomorphic Si1-yCy/Si1-xGex Superlattices", Appl. Phys. Lett 64(6), Feb. 7, 1994.

T. Tezuka et al., "Structural Analyses of Strained SiGe Wires Formed by Hydrogen Thermal Etching and Ge-Condensation Processes", Appl. Phys. Lett. 94, 081910 (2009); doI: 10.1063/1.3086884.

* cited by examiner

SILICON GERMANIUM FIN

TECHNICAL FIELD

The embodiments of this invention relate generally to semiconductor devices and fabrication techniques and, more specifically, relate to the fabrication of semiconductor transistor devices including FinFETs using, for example, Silicon Germanium (SiGe) alloys.

BACKGROUND

The continued miniaturization of metal oxide semiconductor field effect transistors (MOSFETs) has driven the worldwide semiconductor industry. Various impediments to continued scaling have been predicted for decades, but a history of innovation has sustained Moore's Law in spite of many challenges. However, there are growing signs that metal oxide semiconductor transistors are beginning to reach their traditional scaling limits. Since it has become increasingly difficult to improve MOSFETs and therefore complementary metal oxide semiconductor (CMOS) performance through continued scaling, the development of advanced methods for improving performance, in addition to scaling, has become critical. One such method involves using high mobility materials, other than silicon, for CMOS such as Group III-V semiconductors or Silicon Germanium (SiGe) or Ge.

Methods for fabricating Fin structures (where the Fin can be composed of, for example, SiGe semiconductor material) are currently being explored. For the fabrication of Fin-based devices, where the unit cell or node geometry requires small dimensions, a Fin of a certain minimum required height (a vertical dimension relative to a surface upon which the Fin is disposed) can be required. However, for certain SiGe alloy compositions, as one non-limiting example $Si_{1-x}Ge_x$ having a Ge percentage of, for example, 25% (i.e., x=0.25), a critical SiGe thickness can be in a range of about 30 nm to about 35 nm in a metastable state and about 10 nm in a thermal equilibrium state. However, such thicknesses can be less than a minimum required Fin height that is needed to achieve desired node dimensions. FIG. 1 is a graph that illustrates the critical thickness of $Si_{1-x}Ge_x$ layers as a function of Ge mole fraction. The curves show a theoretic kinetic model for various growth temperatures (after J. J. Welser, The application of strained-silicon/relaxed-silicon germanium heterostructures to metal-oxide-semiconductor field effect transistors, PhD Thesis, Stanford University, 1994). The critical thickness is noted for the exemplary Ge mole fraction of 0.25.

It has been found that if the SiGe layer is formed with a thickness that is greater than the critical thickness for a particular Ge mole fraction then defects can be generated in the SiGe film or epilayer. The presence of such defects can be detrimental to subsequent device formation.

Clearly, a need exists to provide a method to form a substantially defect-free SiGe Fin having a height that is greater than the critical thickness for a desired Ge mole fraction.

SUMMARY

In a first aspect thereof the embodiments of this invention provide a method that comprises forming a multilayered stack on a surface of a supporting layer. The multilayered stack is comprised of alternating layers of compressively strained Silicon Germanium ($Si_{1-x}Ge_x$) and tensily strained Carbon-doped Silicon (Si:C). The method further includes etching the multilayered stack to form at least one Fin precursor structure and annealing the Fin precursor structure to remove Carbon from the strained Si:C layers to form Carbon-depleted layers and to diffuse Germanium from the compressively strained $Si_{1-x}Ge_x$ layers into the Carbon-depleted layers to produce a substantially continuous $Si_{1-x}Ge_x$ Fin from the annealed Fin precursor structure.

In another aspect thereof the embodiments of this invention provide a structure that comprises a Semiconductor on Insulator (SOI) layer disposed on a layer of buried insulator (e.g., silicon oxide) and a multilayered stack on a surface of the SOI layer. The multilayered stack is comprised of alternating layers of compressively strained Silicon Germanium ($Si_{1-x}Ge_x$) and tensily strained Carbon-doped Silicon (Si:C). The structure further comprises a hardmask layer disposed on a top surface of the multilayered stack.

DETAILED DESCRIPTION

Figure 1:
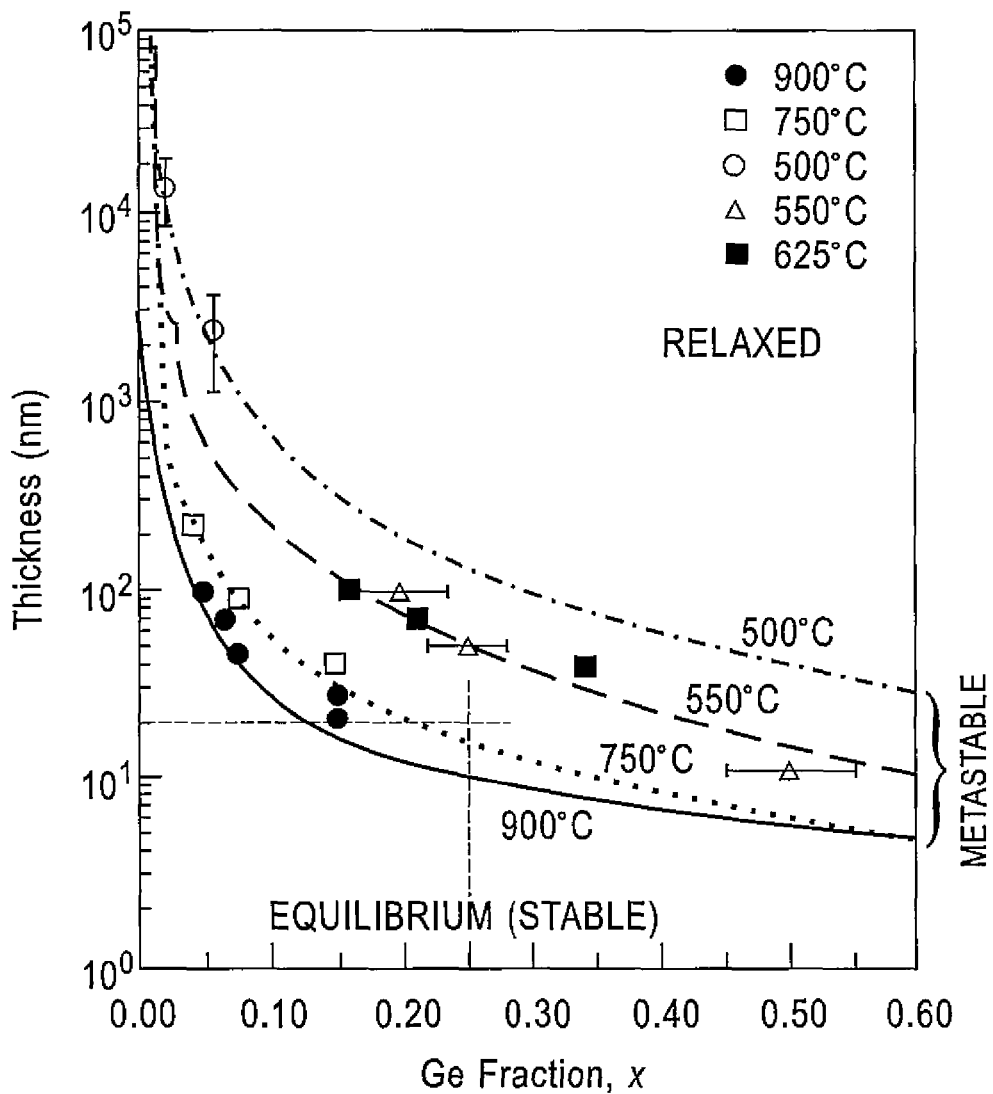
FIG. 1 is a graph that illustrates the critical thickness of $Si_{1-x}Ge_x$ layers as a function of Ge mole fraction, and is useful in explaining a problem that is addressed and overcome by the embodiments of this invention.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100}crystal surface will take on a {100}orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and chemical vapor deposition (CVD). The temperature for an epitaxial deposition process typically ranges from about 550° C. to about 900° C. Although higher temperature will typically result in faster deposition of the semiconductor material, the faster deposition may also result in crystal defects and film cracking.

The embodiments of this invention provide a method and structure for forming a SiGe fin having a height that is greater than its critical thickness. The embodiments of this invention employ at least one layer of tensily strained (a layer that exhibits tensile strain) Si:C (Carbon-doped Silicon) in combination with at least one layer of compressively strained (a layer that exhibits compressive strain) SiGe to balance the compressively strained SiGe during epitaxial deposition to increase the critical thickness of the SiGe. After Fin formation a thermal anneal procedure is performed to drive the Carbon out of the Fin resulting a SiGe Fin having a height (thickness) that exceeds what would be the critical thickness for a conventional SiGe Fin of the same height.

In at least one embodiment thereof this invention can employ Semiconductor on Insulator (SOI) technology, where a thin Si layer is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the thin silicon layer can be divided into active regions by shallow trench isolation (STI) which intersects the BOX and provides total isolation for active device regions formed in the thin Si layer (in the SOI layer). Sources and drains of field effect transistors (FETs) are formed, for example, by ion implantation of N-type and P-type dopant material into the thin Si layer and/or by the formation of raised source/drain (RSD) structures. A FET channel region between a source/drain pair can be created so as to underlie a gate structure.

Figure 2:
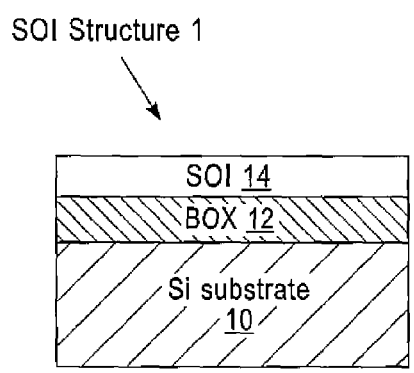
FIG. 2 illustrates an enlarged cross-sectional view (not to scale) of a SOI structure in a first step of a method in accordance with this invention.

FIG. 2 illustrates an enlarged cross-sectional view (not to scale) of a portion of a SOI structure 1 in a first step of a method in accordance with an embodiment of this invention. The SOI structure 1 includes a Si substrate 10 having any desired thickness, a BOX layer 12 overlying a surface of the substrate 10, and a SOI layer 14 that overlies the BOX layer 12. The BOX layer 12 can be comprised of, for example, $SiO_2$ and can have a thickness in an exemplary range of about 10 nm to about 2 μm. The SOI layer 14 can have a thickness in an exemplary range of about 2 nm to about 20 nm.

Figure 3:
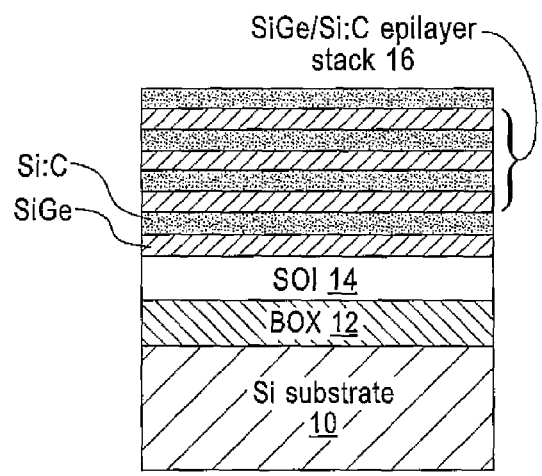
FIG. 3 illustrates, in accordance with embodiments of this invention, the structure of FIG. 2 following the deposition of alternating layers of $Si_{1-x}Ge_x$ and Si:C to form a SiGe/Si:C epilayer stack.

FIG. 3 illustrates, in accordance with embodiments of this invention, the structure of FIG. 2 following the deposition of alternating layers of $Si_{1-x}Ge_x$, having in one non-limiting example a Ge percentage of about 25% (i.e., x=0.25), and Carbon-doped Silicon (Si:C) or, even more specifically, $Si_{1-y}C_y$, where y can be in a range of, as a non-limiting example, about 0.002 to about 0.03 (0.2%-3%). A majority of the Carbon is present in substitutional sites in the crystalline lattice of the Silicon after epitaxy. In some embodiments it can be preferred to deposit the SiGe layer first followed by the Si:C layer to ensure later diffusion of the Ge into the underlying SOI layer 14. Each of the alternating layers can have a thickness in a range of about 2 nm to about 20 nm. While it may be preferred that each of the alternating SiGe/Si:C layers have about the same thickness this is not required. In a minimum case one layer of $Si_{1-x}Ge_x$ and one layer of Si:C (one pair of layers) may be present, although in a typical embodiment there will be more than one pair of layers. The actual number of pairs of layers is a function at least in part of the individual layer thicknesses and a total height of a Fin that will be formed from the layers. In some embodiments the desired Fin height can be in an exemplary range of about 30 nm to about 100 nm. Assuming in a non-limiting example a desired Fin height of 40 nm (which could exceed the critical thickness of a layer of only $Si_{1-x}Ge_x$ where x=0.25) and a thickness of each of the alternating layers of $Si_{1-x}Ge_x$ and Si:C of 5 nm (a 10 nm total thickness for a pair of layers), then four pairs of layers can be deposited one upon the other. MBE or CVD are two examples of epitaxial growth methods to deposit the $Si_{1-x}Ge_x$ layers, while CVD is one suitable example of an epitaxial growth method to deposit the Si:C layers. The end result is the formation of a SiGe/Si:C epitaxial layer (epilayer) stack 16 upon a supporting Si layer, in this case the SOI layer 14. After the formation of the SiGe/Si:C epilayer stack 16 a hardmask (HM) 18 (shown in FIG. 4) is deposited on a top surface of the SiGe/Si:C epilayer stack 16. The HM 18 can be a layer of nitride or a layer of oxide. In the SiGe/Si:C epilayer stack 16 the presence of tensily strained Si:C layers serves to counterbalance the presence of the compressively strained SiGe layers, thereby contributing to increasing the critical thickness.

It is noted that during subsequent processing the Carbon will be removed from the Si:C layers, leaving behind what may be referred to as Carbon-depleted Silicon layers. Germanium from the SiGe layers will be diffused into the Carbon-depleted Silicon layers to form a unitary layer comprised substantially of only SiGe. In some exemplary embodiments the initial Ge concentration of the SiGe layers of the layer pairs is preferably set to a value greater than a desired final Germanium concentration to accommodate the diffusion of the Germanium. In a simplest case, if a final desired value of x in a Fin containing the $Si_{1-x}Ge_x$ material is 0.25 then the initial, as grown, concentration in the individual $Si_{1-x}Ge_x$ layers of the SiGe/Si:C layer pairs can be, for example, about 0.5.

In some embodiments a condensation process can be performed to increase the Ge concentration in the final SiGe Fin after fin patterning. In those embodiments the Ge concentration in the initial SiGe layers can be greater than, equal to, or less than the Ge concentration in the final SiGe fin.

Figure 4:
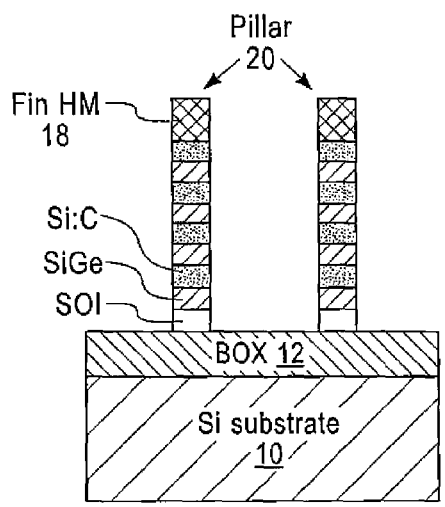
FIG. 4 shows the structure of FIG. 3 after deposition of a hardmask layer and after the hardmask layer and the SiGe/Si:C epilayer stack are patterned and etched to form Fin precursor structures, also referred to herein simply as pillars.

FIG. 4 shows the structure of FIG. 3 after the HM layer 18 is deposited and after the HM 18 and the SiGe/Si:C epilayer stack 16 are patterned and etched to form Fin precursor structures having a generally pillar-like shape (referred to herein for convenience as pillar structures 20). The etching process also removes exposed portions of the SOI layer 14 so that the resulting pillar structures 20 are disposed on the surface of the BOX (dielectric) layer 12. The pillar height (minus the thickness of the HM layer 18) corresponds to the desired Fin height (e.g., 30 nm-100 nm).

Figure 5:
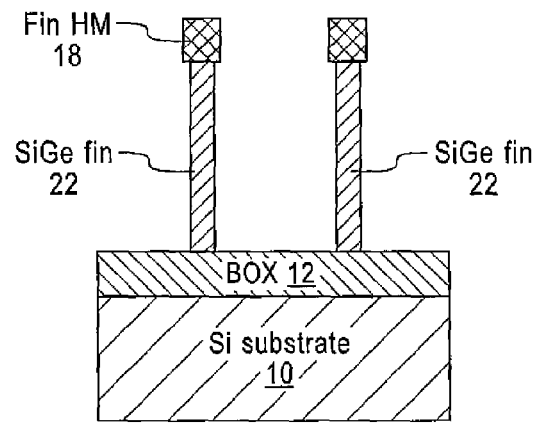
FIG. 5 shows the structure of FIG. 4 after an anneal procedure that removes interstitial Carbon from the Si:C layers of the Fin precursor structures, and that diffuses the Ge from the SiGe layers into the surrounding Carbon-depleted Si layers to form a substantially continuous SiGe Fin.

The pillar width can be somewhat greater than the desired Fin width due to a potential loss of pillar material during an optional oxidation step described below with respect to FIG. 5. Exemplary Fin widths can be in a non-limiting range of about 4 nm to about 20 nm, with about 6 nm to about 10nm being one suitable but non-limiting desired range of widths. The pillar length (into the page of the drawing) corresponds to the desired Fin length. Masking in combination with a reactive ion etch (RIE) is one suitable procedure for selectively removing material from the SiGe/Si:C epilayer stack 16 to form the pillar structures 20.

The pillar structure 20 can be formed by any suitable patterning techniques such as lithography followed by RIE, or by a sidewall imaging transfer technique. In some embodiments the SiGe/Si:C/SOI layers have a similar width after pillar formation. In other words, the pillar sidewalls are substantially vertical. In some embodiments, the SiGe/Si:C/SOI layer may have a slightly different width after formation. In this case the maximum width difference between adjacent layers can be less than, for example, about 3 nm. In some embodiments, the sidewall of the pillar structure 20 may not be perfectly vertical. Instead, the sidewall may have an angle that is about, for example, about 80-89.8 degrees.

In is noted that once the Fin is formed, the critical thickness of the SiGe is no longer determined by the Fin height. Instead, it is determined by the width of the Fin. Therefore, as long as the Fin width is less than the critical thickness, the Fin can be made as tall as needed without generating defects. FIG. 5 shows the structure of FIG. 4 after an anneal procedure that removes the interstitial Carbon from the Si:C layers of the pillar structures 20 and diffuses the Ge from the SiGe layers of the pillar structures 20 into the surrounding Carbon-depleted Si layers, thereby forming a substantially continuous SiGe Fin 22 having the desired concentration of Ge and a height that exceeds what would conventionally be considered to be the critical height. The anneal process can be performed in an inert environment (such as in a Nitrogen or an Argon environment). The anneal temperature and time are set so as to be sufficient to diffuse the Ge (e.g., about 900° C. to about 1150° C. for a few seconds to a few minutes). After the anneal process or processes, a majority of Carbon moves from substitutional sites to interstitial sites. As a result, the strain in the SiGe Fin is compressive and the compressive strain is mainly determined by the Ge concentration.

The anneal process could also be performed in an Oxygen environment whereby interstitial Carbon is removed by reacting with Oxygen to form $CO_2$ (e.g., about 1000° C. to about 1150° C. for a few minutes). Multiple anneals can be performed during the anneal process. For example, one anneal can be performed to move a majority of Carbon from substitutional sites to interstitial sites, and another anneal to simultaneously remove the interstitial Carbon and to diffuse the Ge into the surrounding Carbon-depleted Si layers. It can be noted that the anneal procedure can reduce, such as by oxidation, the width of the pillar structures 20 so that the resulting SiGe fins 22 have a smaller width. In the case that the anneal process involves oxidation, the Oxygen also reacts with Silicon to form Silicon Oxide. Meanwhile, Ge is repelled towards the core of the pillar 20. As a result, the Ge concentration in the final SiGe fin is increased after oxidation. Such a Ge enrichment process can be referred to as "condensation".

As one non-limiting example, if the pillar structures 20 have a width of 12 nm then the SiGe Fins 22 may have a width of about 6 nm-8 nm. In a case where Silicon Oxide is formed on sidewalls of the pillar 20, the Silicon Oxide can be removed from the sidewalls by any suitable oxide etch process such as wet etch containing diluted hydrofluoric acid.

Although not shown in the Figures, the HM 18 is removed and the Fins 22 can then be further processed to define source and drain regions, suitable gate structures and conductors are formed in order to provide transistors, such as P-type FinFETs and N-type FinFETs, as needed.

In a still further embodiment of this invention the SiGe/Si:C epilayer stack 16 can be formed instead upon the top surface of the Si substrate 10, and the BOX layer 12 and the SOI layer 14 can be omitted. In this case the Si substrate 10 can be considered to be the Si supporting layer. In this embodiment the SiGe Fins 22 are formed on the surface of the bulk Si substrate, and the Ge will diffuse downwards into the Si substrate 10 during the anneal procedure that diffuses the Ge.

In accordance with the foregoing embodiments an aspect of this invention involves forming alternating layers of SiGe and Si:C on a Silicon layer (either the SOI layer 14 or the bulk Si substrate 10), where the percentage of Ge in the SiGe layers can be equal to or greater than, for example, 25%, and where the percentage of C in the Si:C layers can be in an exemplary range of about 0.2% to about 3%. In the alternating layers of SiGe and Si:C the SiGe layers are compressively strained and the Si:C layers are tensily strained. The SiGe/Si:C epilayer stack 16 that is thus constructed is then etched to form the pillar structures 20, which can be considered as Fin precursor structures, and at least one anneal procedure is carried out to remove interstitial C and diffuse the Ge, thereby forming substantially continuous SiGe Fins 22. The Ge concentration in the substantially continuous SiGe Fins can be in an exemplary range of about 15% to about 30%. The Fins 22 can have a height that is equal to or greater than, for example, about 30 nm high and a width that is equal to or less than, for example, about 12 nm.

It is noted that any one of the structures shown in FIGS. 2-5 could be viewed as an intermediate structure formed during the overall process of fabricating the Fins 22.

It is to be understood that although the exemplary embodiments discussed above with reference to FIGS. 2-5 can be used on common variants of the FET device including, e.g., FET devices with multi-fingered FIN and/or gate structures and FET devices of varying gate width and length.

Moreover, transistor devices can be connected to metalized pads or other devices by conventional ultra-large-scale integration (ULSI) metallization and lithographic techniques.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching and other material removal processes may be used by those skilled in the art. Further, the exemplary embodiments are not intended to be limited to only those semiconductor materials, Ge concentrations, Carbon concentrations, dielectrics, layer thicknesses, anneal temperatures/times and the like that were specifically disclosed above. Any and all such and similar modifications of the teachings of this invention will still fall within the scope of this invention.

What is claimed is:

1. A method, comprising:
   forming a multilayered stack on a surface of a supporting layer, the multilayered stack being comprised of alternating layers of compressively strained Silicon Germanium ($Si_{1-x}Ge_x$) and tensily strained Carbon-doped Silicon (Si:C);
   etching the multilayered stack to form at least one Fin precursor structure; and
   annealing the Fin precursor structure to remove Carbon from the strained Si:C layers to form Carbon-depleted layers and to diffuse Germanium from the compressively strained $Si_{1-x}Ge_x$ layers into the Carbon-depleted layers to produce a substantially continuous $Si_{1-x}Ge_x$ Fin from the annealed Fin precursor structure.

2. The method as in claim 1, where a value of x in the compressively strained $Si_{1-x}Ge_x$ layers is greater than a value of x in the substantially continuous $Si_{1-x}Ge_x$ Fin.

3. The method as in claim 1, where a value of x in the substantially continuous $Si_{1-x}Ge_x$ Fin is in a range of about 15% to about 30%.

4. The method as in claim 1, where a concentration of Carbon in the Si:C layers is in a range of about 0.2% to about 3%.

5. The method as in claim 1, where each of the layers of the multilayered stack has a thickness in a range of about 2 nm to about 20 nm.

6. The method of claim 1, where a height of the substantially continuous $Si_{1-x}Ge_x$ Fin is greater than a critical height.

7. The method as in claim 1, where annealing uses at least two sequentially performed anneal processes.

8. The method as in claim 1, where the supporting layer is a Semiconductor on Insulator (SOI) layer disposed over a buried oxide (BOX) layer.

9. The method as in claim 1, where the supporting layer is a bulk silicon substrate.

10. The method of claim 1, where for a given Ge concentration, a final SiGe fin width is less than the critical thickness.

11. The method of claim 1, where a Ge concentration in the at least one tensily strained SiGe layer is equal to, less than, or greater than a Ge concentration in the substantially continuous SiGe Fin.

12. The method of claim 1, where the anneal results in a condensation of Ge in the Fin precursor structure.

13. The method as in claim 1, where when forming the tensily strained Carbon-doped Silicon (Si:C) a majority of Carbon atoms are in substitutional sites resulting in tensile strain.

14. The method as in claim 1, where in the Carbon-doped Silicon (Si:C) a majority of Carbon atoms are in substitutional sites, and where the anneal moves the Carbon atoms to interstitial sites and then removes the Carbon atoms.

* * * * *